US012685096B2

(12) United States Patent
Lee

(10) Patent No.: US 12,685,096 B2
(45) Date of Patent: Jul. 14, 2026

(54) METHOD OF MANUFACTURING SOI WAFER

(71) Applicant: Korea Advanced Institute of Science and Technology, Daejeon (KR)

(72) Inventor: Jungchul Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 283 days.

(21) Appl. No.: 18/353,387

(22) Filed: Jul. 17, 2023

(65) Prior Publication Data

US 2024/0038581 A1 Feb. 1, 2024

(30) Foreign Application Priority Data

Jul. 26, 2022 (KR) ........................ 10-2022-0092540
Jun. 28, 2023 (KR) ........................ 10-2023-0083459

(51) Int. Cl.
*H10P 90/00* (2026.01)
*H10P 95/00* (2026.01)
*H10W 10/10* (2026.01)

(52) U.S. Cl.
CPC ...... *H10P 90/1908* (2026.01); *H10P 90/1916* (2026.01); *H10P 95/00* (2026.01); *H10W 10/181* (2026.01)

(58) Field of Classification Search
CPC ........... H01L 21/76243; H01L 21/3105; H01L 21/76254; H01L 21/764; H01L 21/7624; H10P 90/1906; H10P 90/1908; H10P 90/1916; H10P 95/00; H10W 10/181; H10W 10/021; H10W 10/20
See application file for complete search history.

(56) References Cited

U.S. PATENT DOCUMENTS 5,943,589 A * 8/1999 Ogushi ............. H01L 21/76232
257/E21.549
2021/0005630 A1* 1/2021 Hurwitz ............ H01L 21/76289

FOREIGN PATENT DOCUMENTS

KR 2001-0034372 A 4/2001

OTHER PUBLICATIONS

Korean Office Action (with English Translation) dated Dec. 15, 2025 for Korean Application No. 10-2023-0083459; 11 Pages.

* cited by examiner

*Primary Examiner* — Dale E Page
*Assistant Examiner* — Quovaunda Jefferson
(74) *Attorney, Agent, or Firm* — DALY, CROWLEY, MOFFORD & DURKEE, LLP

(57) ABSTRACT

A SOI wafer is formed by forming a hole array on a surface of a wafer including a semiconductor material, forming a membrane-cavity structure by annealing process on the wafer, forming a buried oxide layer on an inside of the cavity and an outer oxide layer on an outside of the membrane, and forming a device layer by removing the outer oxide layer.

17 Claims, 10 Drawing Sheets

METHOD OF MANUFACTURING SOI WAFER

CROSS-REFERENCE TO RELATED APPLICATION

This U.S. non-provisional application claims priority under 35 USC § 119 from Korean Patent Application No. 10-2022-0092540, filed on Jul. 26, 2022 and Korean Patent Application No. 10-2023-0083459, filed on Jun. 28, 2023 in the Korean Intellectual Property Office (KIPO), the disclosure of which is hereby incorporated by reference in its entirety.

BACKGROUND

1. Technical Field

The present invention relates to a method for manufacturing a SOI wafer, and may also be applied to a method for manufacturing a germanium-on-insulator wafer in which germanium is applied instead of silicon.

2. Description of the Related Art

A SOI wafer (silicon-on-insulator wafer) is a wafer in which a thin silicon oxide insulating layer (e.g., buried oxide or BOX layer) is formed between a thin single crystal silicon (a device layer) and a bulk silicon substrate (a base layer). When an SOI wafer is used, an insulating wall or a well formation process is unnecessary, and thus, the SOI wafer is used for semiconductor devices and MEMS devices.

Currently used SOI wafer fabrication process utilizes ion implantation process or bonding process, representatively Separation by IMplatation of OXygen (SIMOX), Smart Cut™, Bond and Etch-back (BE), ELTRAN®, etc.

However, due to the complicated manufacturing process of the SOI wafer, the price of the SOI wafer is very high, and most of the current domestic consumption is imported from foreign manufacturers. In addition, currently used SOI wafer fabrication processes have the inconvenience that thinning, splitting, and polishing processes are essential, the thickness uniformity of the device layer is limited, and the bonding strength between the base layer and the silicon oxide insulating layer is weak.

SUMMARY

Some embodiments of the present disclosure are to provide a method capable of manufacturing a SOI wafer with uniform thickness of a device layer and improved bonding strength, by utilizing simple manufacturing process (etching, annealing, and oxidation).

A method of manufacturing a SOI wafer may include forming a hole array on a surface of a wafer including a semiconductor material, forming a membrane-cavity structure by performing an annealing process on the wafer, the membrane-cavity structure including a cavity corresponding to the hole array and a membrane disposed on the cavity, forming a buried oxide layer on an inside of the cavity and a first outer oxide layer on an outside of the membrane, and forming a device layer by removing the first outer oxide layer.

In an embodiment, the buried oxide layer and the first outer oxide layer may be formed together.

In an embodiment, a thickness of the buried oxide layer may be about 1.5 to 2.5 times a thickness of the cavity.

In an embodiment, the buried oxide layer may include a lower oxide layer formed on a lower portion of the cavity and an upper oxide layer formed on an upper portion of the cavity.

In an embodiment, the lower oxide layer may be formed toward to the upper portion, the upper oxide layer may be formed toward to the lower portion, and the buried oxide layer may be formed while the lower oxide layer and the upper oxide layer contact each other.

In an embodiment, the hole array may include a plurality of holes, and each of the holes may have a preset diameter-to-depth ratio.

In an embodiment, the cavity may be formed by connecting the holes to each other while the annealing process is performed.

In an embodiment, a thickness of the cavity may be set according to the diameter-to-depth ratio of the each of the holes.

In an embodiment, the method may further include forming an inlet connecting the cavity and an outside.

In an embodiment, the cavity and the inlet may be formed together.

In an embodiment, the annealing process may be performed in vacuum.

In an embodiment, the cavity and the inlet may be formed separately.

In an embodiment, the annealing process may be performed at atmospheric pressure.

In an embodiment, the method may further include forming a second outer oxide layer on an outside of the membrane, after forming the first outer oxide layer.

In an embodiment, the second outer oxide layer may be removed together with the first outer oxide layer.

In an embodiment, a thickness of the device layer may be less than or equal to a difference between a thickness of the membrane and a thickness of the cavity.

In an embodiment, a thickness of the device layer may be set according to a thickness of the second outer oxide layer.

In an embodiment, the membrane-cavity structure may further include a base layer disposed under the cavity.

In an embodiment, the method may further include forming a third outer oxide layer on an outside of the base layer, and the third outer oxide layer may be formed together with the buried oxide layer and the first outer oxide layer.

Therefore, according to the method for manufacturing a SOI wafer according to an embodiment of the present invention, a membrane-cavity structure having an inlet may be formed by utilizing a hole array formed on a surface of a wafer, and oxide layers may be simultaneously grown on an inside of a cavity and an outside of a membrane by performing the oxidation process.

As the buried oxide layer is formed through the oxidation process, complex production processes such as ion implantation and bonding may not be performed, and bonding strength of the buried oxide layer may be improved. In addition, as the outer oxide layer is formed through the same oxidation process, the thickness of the device layer may be easily adjusted, and the thickness uniformity of the device layer may be improved.

In addition, since the annealing process and the oxidation process, which are main processes, may be performed simultaneously for one lot (25 sheets) (batch fabrication), the manufacturing time of the SOI wafer can be drastically reduced.

In addition, the above-described manufacturing method can be applied to a method of manufacturing a double or triple SOI wafer, and can also be applied to a method of manufacturing a germanium-on-insulator wafer by applying to germanium rather than silicon.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
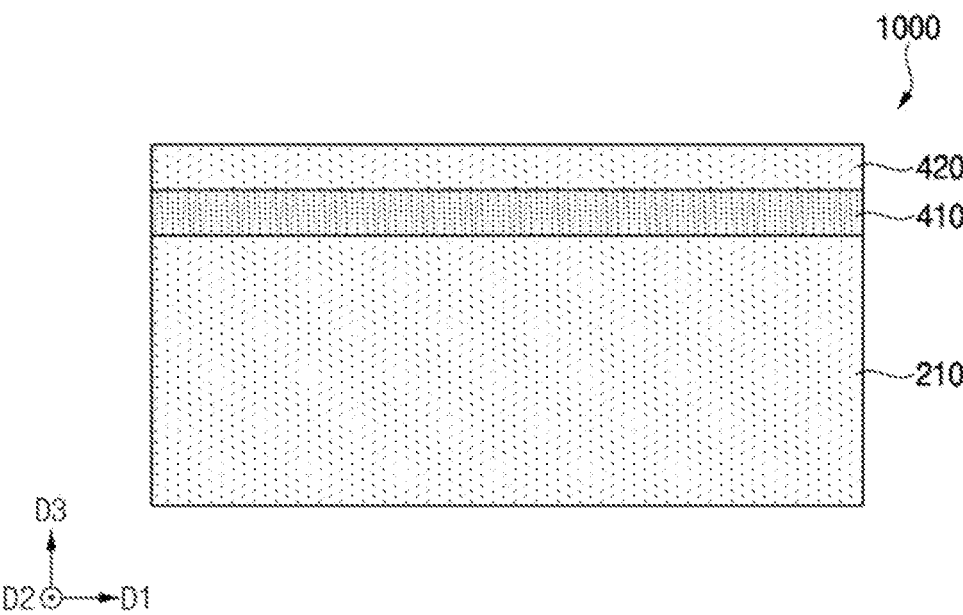
FIG. 1 is a cross-sectional view illustrating a SOI wafer according to an embodiment of the present invention.

The present inventive concept now will be described more fully hereinafter with reference to the accompanying drawings, in which embodiments of the present invention are shown. The present inventive concept may, however, be embodied in many different forms and should not be construed as limited to the embodiments set forth herein.

Rather, these embodiments are provided so that this disclosure will be thorough and complete, and will fully convey the scope of the present invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the inventive concept as used herein.

Hereinafter, the present inventive concept will be explained in detail with reference to the accompanying drawings.

Figure 2:
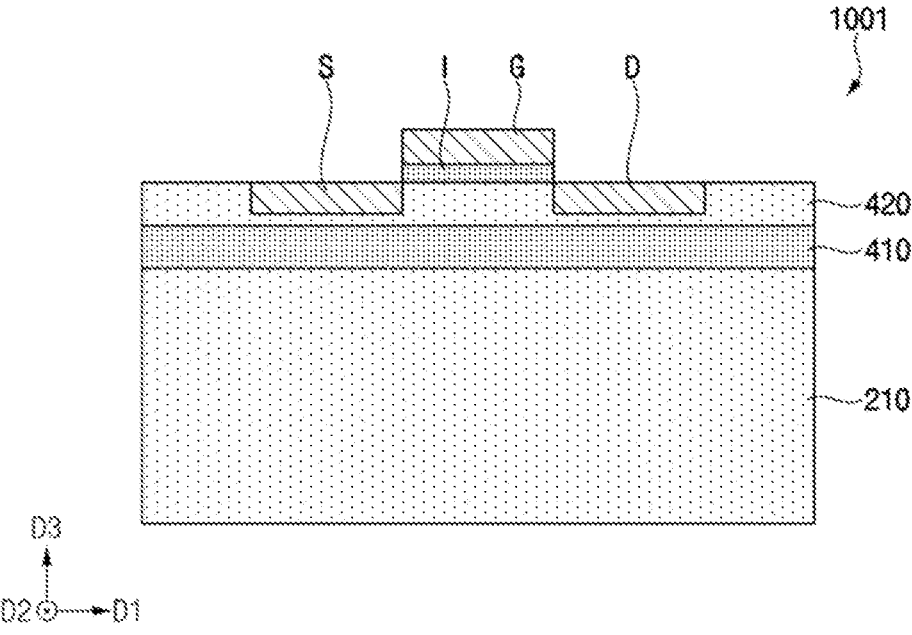
FIGS. 2 and 3 are diagrams illustrating examples using the SOI wafer of FIG. 1.
Figure 3:
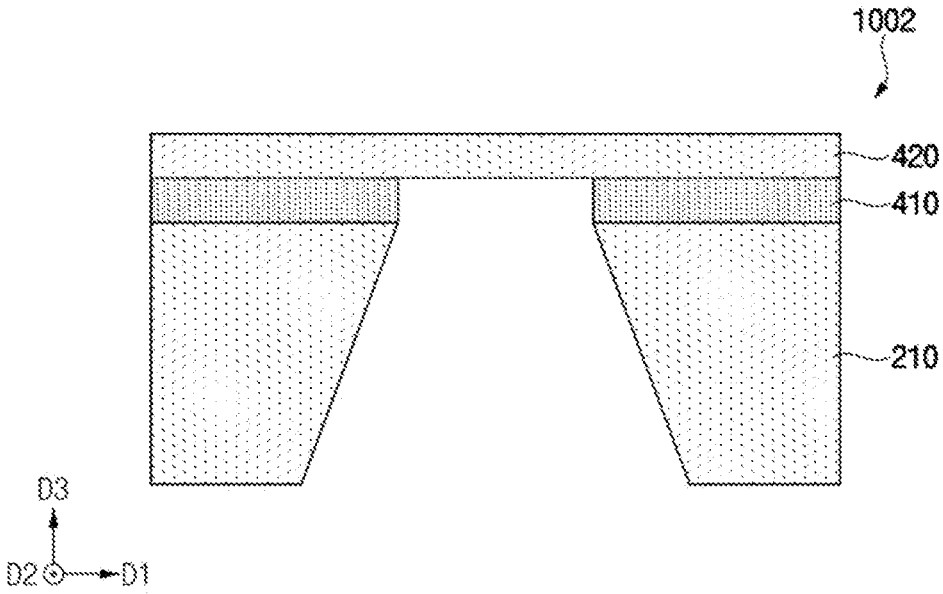

FIG. 1 is a cross-sectional view illustrating a SOI wafer according to an embodiment of the present invention. FIGS. 2 and 3 are diagrams illustrating examples using the SOI wafer of FIG. 1.

Referring to FIG. 1, a SOI wafer 1000 according to an embodiment of the present invention may include a base layer 210, a buried oxide layer (or BOX layer) 410, and a device layer 420.

For example, the base layer 210 may include a semiconductor material such as silicon, germanium, or silicon-germanium.

The buried oxide layer 410 may be disposed on the base layer 210. The buried oxide layer 410 may be a silicon oxide layer, a germanium oxide layer, or the like, and may be formed by oxidizing the base layer 210 and the device layer 420.

The device layer 420 may be disposed on the buried oxide layer 410. The device layer 420 may include the same semiconductor material as the base layer 210, such as silicon, germanium, or silicon-germanium.

Referring to FIGS. 2 and 3, the SOI wafer 1000 may be used for a semiconductor device 1001 and a MEMS device 1002. When the SOI wafer 1000 is used as the semiconductor device 1001, it is not necessary to form an insulating wall or a well, and thus the production period and the production cost can be reduced. When the SOI wafer 1000 is used as the MEMS device 1002, the buried oxide film 410 can be used as an etch stop layer, so that the MEMS device 1002 having a uniform thickness can be produced.

FIGS. 4, 5, 6, 7, 8, 9, 10, 11, 12, 13, 14, and 15 are diagrams illustrating an example of a method of manufacturing the SOI wafer of FIG. 1.

Figure 4:
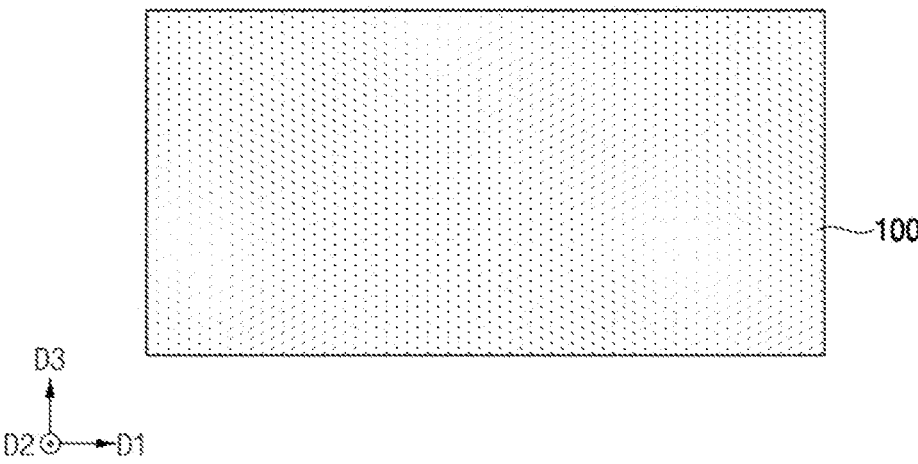
FIGS. 4, 5, 6, 7, 8, 9, 10, 11, 12, 13, 14, and 15 are diagrams illustrating an example of a method of manufacturing the SOI wafer of FIG. 1.
Figure 5:
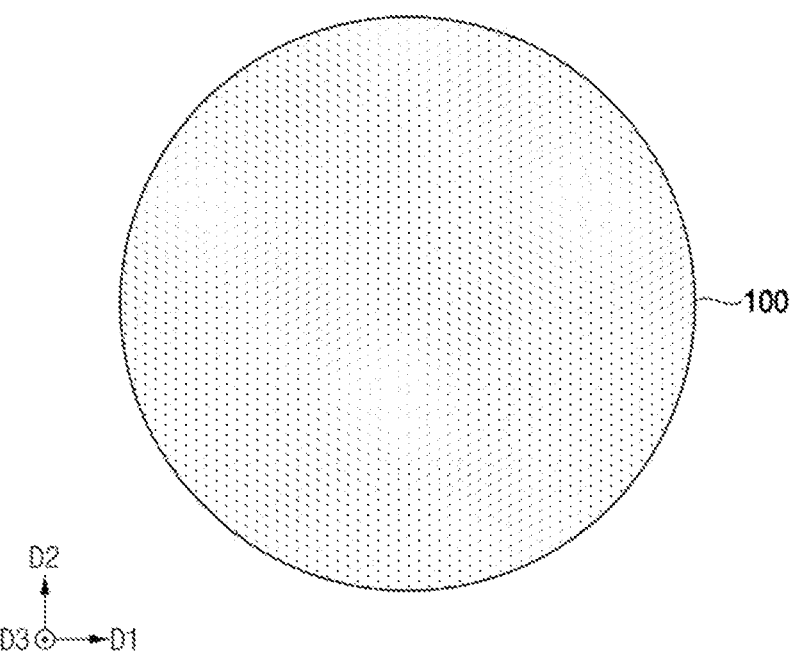

Referring to FIGS. 4 and 5, a wafer 100 including a semiconductor material may be prepared and cleaned. For example, the wafer 100 may be prepared as a silicon wafer, and a thickness and a shape of the wafer 100 may be appropriately selected as needed.

Figure 6:
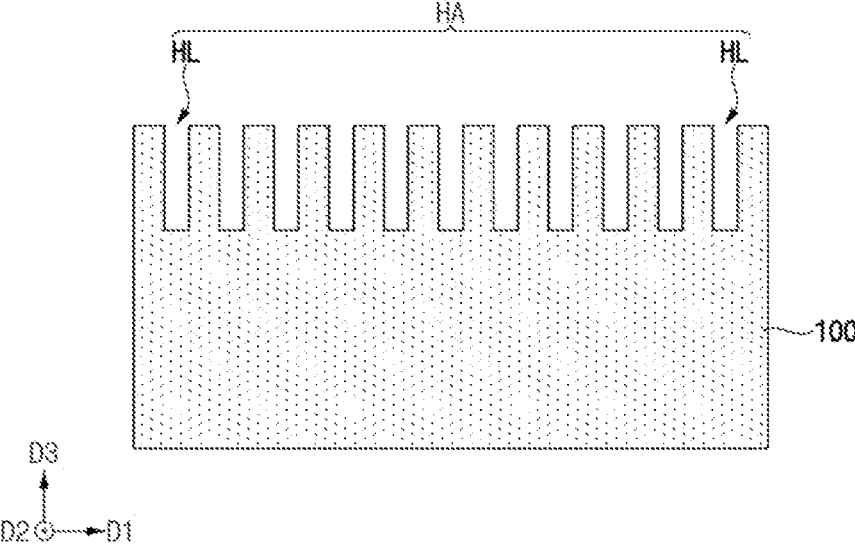
Figure 7:
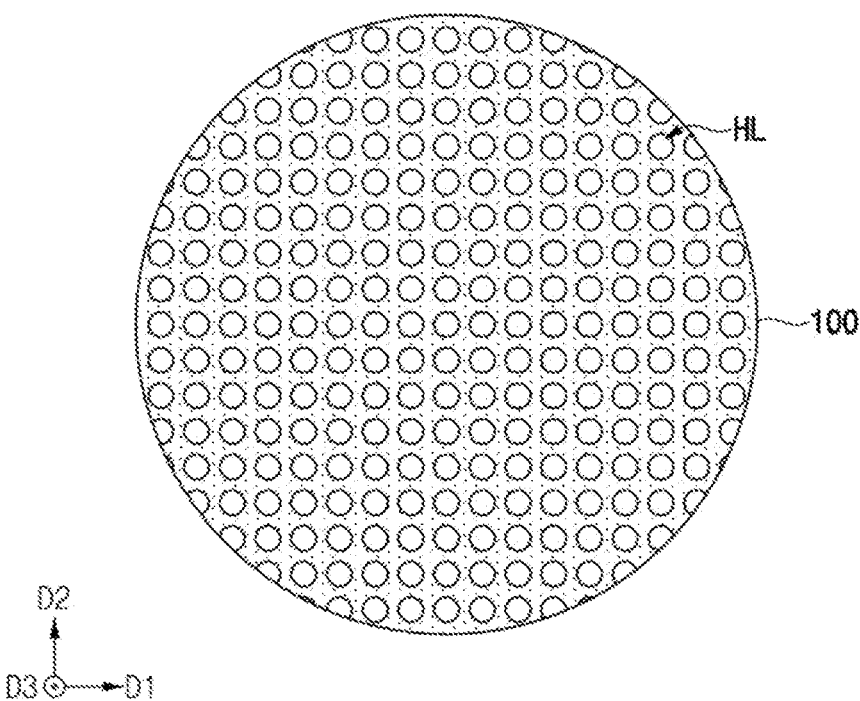

Referring to FIGS. 6 and 7, a hole array HA may be formed on a surface of the wafer 100. The hole array HA may include a plurality of holes HL formed at regular intervals, and each of the holes HL may have a preset diameter-to-depth ratio. For example, each of the holes HL may have a diameter of about 900 nm and a diameter-to-depth ratio of about 1:5.

The holes HL may be formed by an etching process such as a dry etching process or a wet etching process. In an embodiment, the holes HL may be formed by the dry etching process using gas, plasma, ion beam, or the like. For example, the holes HL may be formed with a constant diameter-to-depth ratio through a deep reactive ion etching (DRIE) process.

Figure 8:
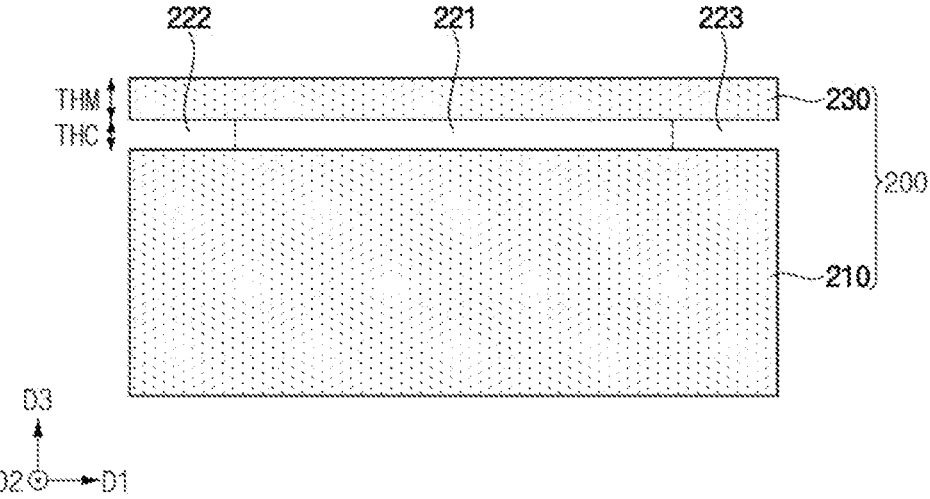
Figure 9:
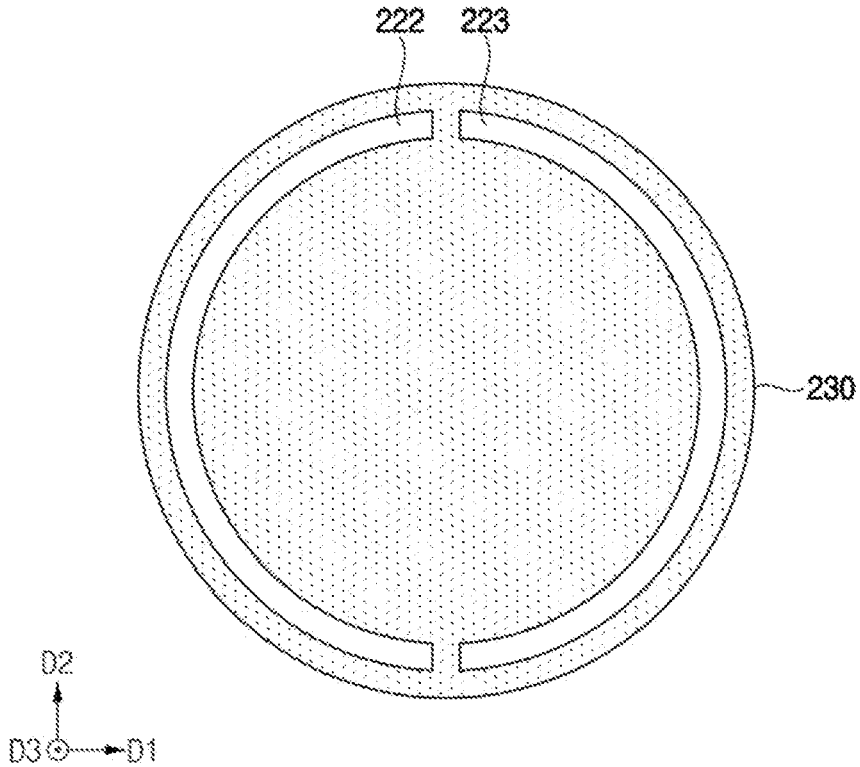

Referring to FIGS. 8 and 9, a membrane-cavity structure 200 including a base layer 210, a cavity 221, and a membrane 230 may be formed by performing an annealing process on the wafer 100. The cavity 221 may be formed on the base layer 210, and the membrane 230 may be formed on the cavity 221.

In an embodiment, the annealing process may be performed at high temperature (about 1150° C.) and vacuum (about $6\times10^{-7}$ bar). As the annealing process is performed, a surface diffusion phenomenon of the semiconductor material included in the wafer 100 may occur, so that the holes HL formed on the surface of the wafer 100 may be connected to each other. Accordingly, the self-assembled cavity 221 and membrane 230 may be formed.

Meanwhile, when the annealing process is performed in a vacuum, stiction failure of the membrane 230 may occur due to vacuum pressure inside the cavity 221, while the wafer 100 is taken out under atmospheric pressure. In this case, since the annealing time required for self-assembly is proportional to the value obtained by dividing the square of each diameter of the holes HL by the diffusion coefficient, holes HL having a larger diameter may be selectively formed only at the edge of the wafer 100 in order to form the cavity 221 and inlets 222 and 223.

In an embodiment, the inlets 222 and 223 may be formed together with cavity 221. For example, when the annealing process is performed in the vacuum, the inlets 222 and 223 may be formed together with the cavity 221. The inlets 222 and 223 may connect the cavity 221 to the outside. In a subsequent oxidation process, an oxidizing agent may flow into the cavity 221 through inlets 222 and 223. As shown in FIG. 9, the inlets 222 and 223 may be formed as arc-shaped slits, but the shape of each of the inlets 222 and 223 is not limited thereto.

In an embodiment, a thickness THC of the cavity 221 may be set according to the diameter of each of the hole HL and the diameter-to-depth ratio of each of the holes HL. For example, when the diameter of the holes HL is about 900 nm and the diameter-to-depth ratio is about 1:5, the thickness THC of the cavity 221 may be about 2 μm and a thickness THM of the membrane 230 may be about 2.7 μm.

Figure 10:
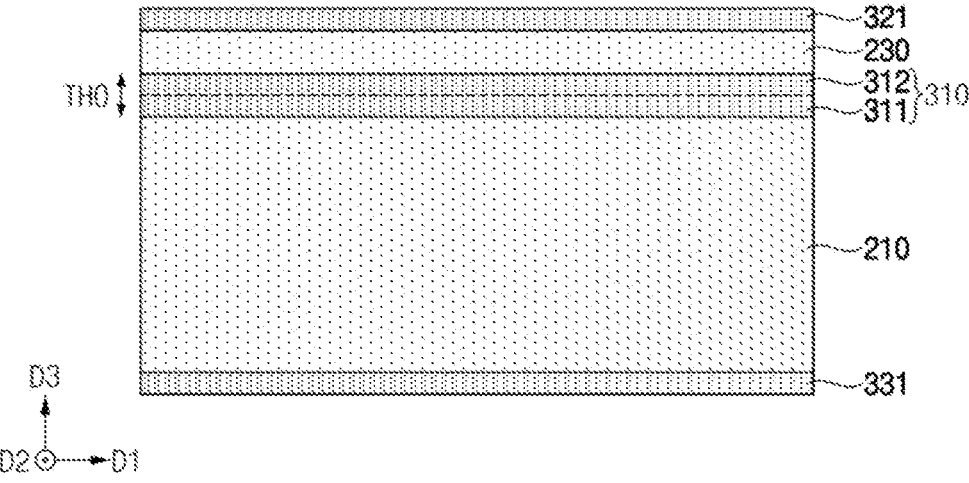
Figure 11:
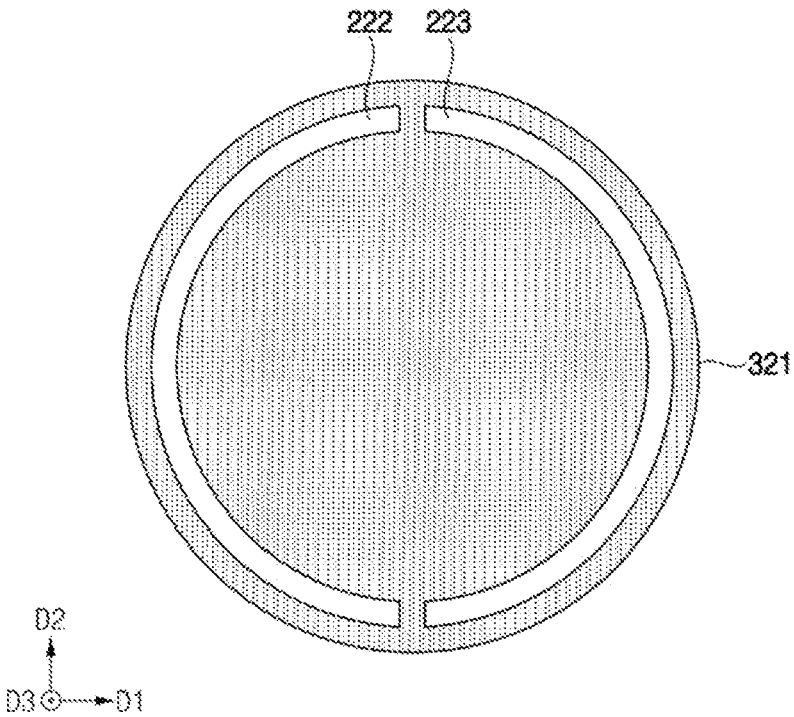

Referring to FIGS. 10 and 11, a buried oxide layer 310, a first outer oxide layer 321, and a third outer oxide layer 331 may be formed.

In order to form an insulating layer on an inside of the cavity 221, a low pressure chemical vapor deposition process (LPCVD) or an oxidation process for depositing the insulating layer may be considered.

In the case of the low pressure chemical vapor deposition process (LPCVD), a film precursor may have a long mean free path due to a low pressure, and thus a step coverage may be improved. However, it is difficult to deposit an insulating layer on the entire inside of the cavity 221 due to a relatively narrow entrance area, and the quality of the deposited insulating layer is not good.

On the other hand, in the case of the oxidation process, since the oxidizing agent flow into the cavity 221 at the beginning of the process is not exhausted and continuously diffuses, it is possible to form an oxide layer throughout the inside of the cavity 221, and the grown quality of the oxide layer is also excellent.

Accordingly, a wet oxidation process may be performed by providing an oxidizing agent ($O_2$ or $H_2O$) to the membrane-cavity structure 200. Accordingly, the buried oxide layer 310 may be formed on the inside of the cavity 221, a first outer oxide layer 321 may be formed on the outside of the membrane 230, and a third outer oxide layer 331 may be formed on the outside of the base layer 210. In an embodiment, the buried oxide layer 310, the first outer oxide layer 321, and the third outer oxide layer 331 may be formed together.

In an embodiment, the buried oxide layer 310 may include a lower oxide layer 311 and an upper oxide layer 312.

The lower oxide layer 311 may be formed on a lower portion of the cavity 221. For example, the lower oxide layer 311 may be formed by oxidizing the inner surface of the base layer 210 and may be formed toward an upper portion (e.g., toward a third direction D3 of FIG. of the cavity 221.

The upper oxide layer 312 may be formed on the upper portion of the cavity 221. For example, the upper oxide layer 312 may be formed by oxidizing the inner surface of the membrane 230 and may be formed toward the lower portion (e.g., in a direction opposite to the third direction D3 of FIG. 10).

The buried oxide layer 310 may be formed while the lower oxide layer 311 and the upper oxide layer 312 contact each other. As the lower oxide layer 311 and the upper oxide layer 312 grow, respectively, a nanogap (a gap of 30 nm or less) may be defined between the lower oxide layer 311 and the upper oxide layer 312 during the process, and the nanogap may be removed by continuously introducing an oxidizing agent through the inlets 222 and 223. When the nanogap is removed and the inside of the cavity 221 is saturated with an oxide layer, the thickness of the membrane 230 may be about 800 nm to 900 nm, and the thickness of the membrane 230 may be further reduced by a subsequent additional oxidation process.

Meanwhile, in order to prevent the entire membrane 230 from being oxidized and removed before the buried oxide layer 310 is completely formed, the thickness THM of the membrane 230 may be set greater than the thickness THC of the cavity 221. The thickness THM of the membrane 230 and the thickness THC of the cavity 221 may be adjusted through the diameter-to-depth ratio of the holes HL.

In an embodiment, a thickness THO of the buried oxide layer 310 may be about 1.5 to 2.5 times the thickness THC of the cavity 221. For example, the thickness THO of the buried oxide layer 310 may be about twice the thickness THC of the cavity 221.

The first outer oxide layer 321 may be formed on the outside of the membrane 230, and the third outer oxide layer 331 may be formed on the outside of the base layer 210. Since the crystal orientations of the outer surface of the membrane 230, the inner surface of the membrane 230, and the inner surface of the base layer 210 are all (100), the areal densities of silicon atoms are all the same. Accordingly, growth rates of the lower oxide layer 311, the upper oxide layer 312, and the first outer oxide layer 321 may all be the same.

Figure 12:
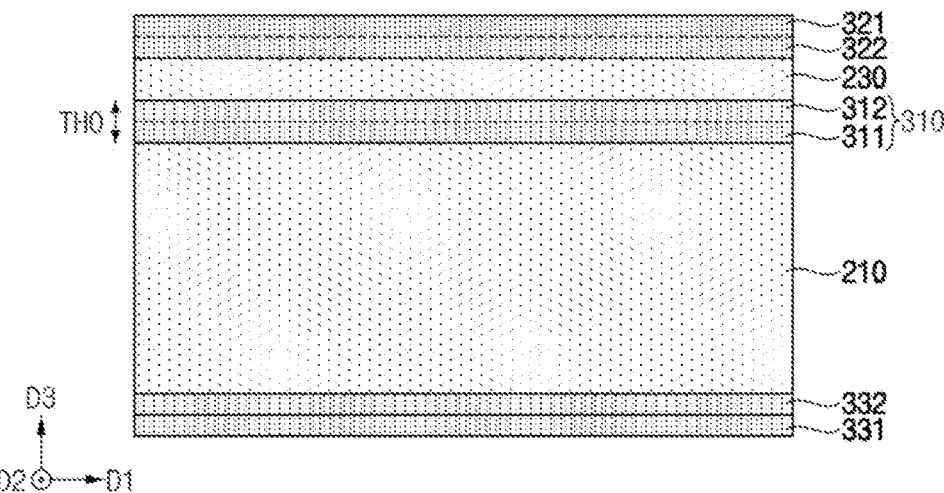
Figure 13:
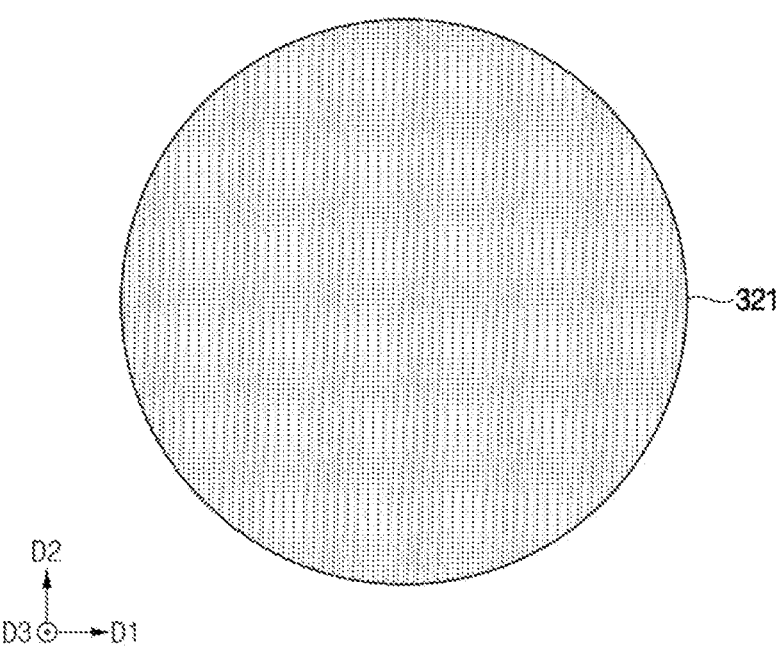

Referring to FIGS. 12 and 13, after the buried oxide layer 310 is all formed, a second outer oxide layer 322 may be formed on the outside of the membrane 230, and a fourth outer oxide layer 332 may be formed on the outside of the base layer 210. For example, as the wet oxidation process is further performed, the second outer oxide layer 322 and the fourth outer oxide layer 332 may be further formed on the outside of the membrane-cavity structure 200. As the second outer oxide layer 322 is formed, the thickness of the membrane 230 may be adjusted.

Figure 14:
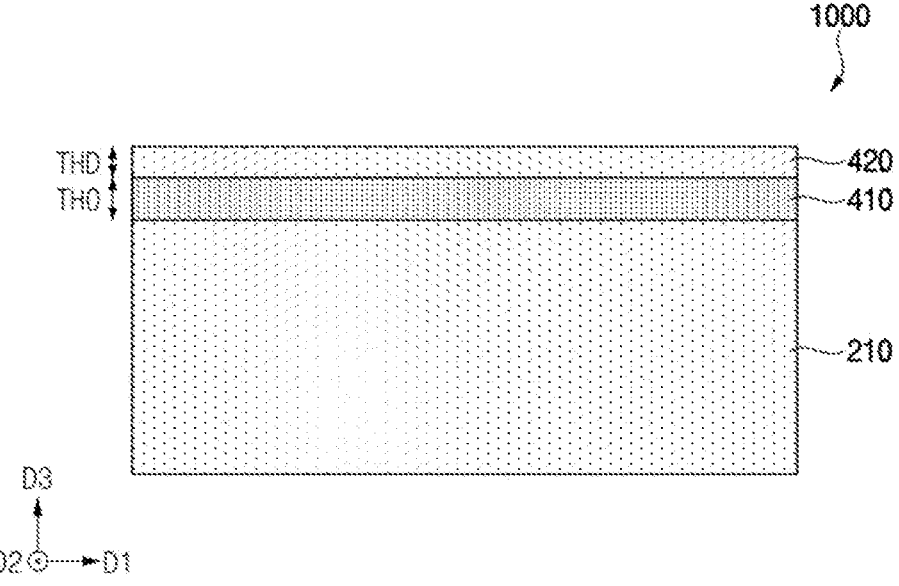
Figure 15:
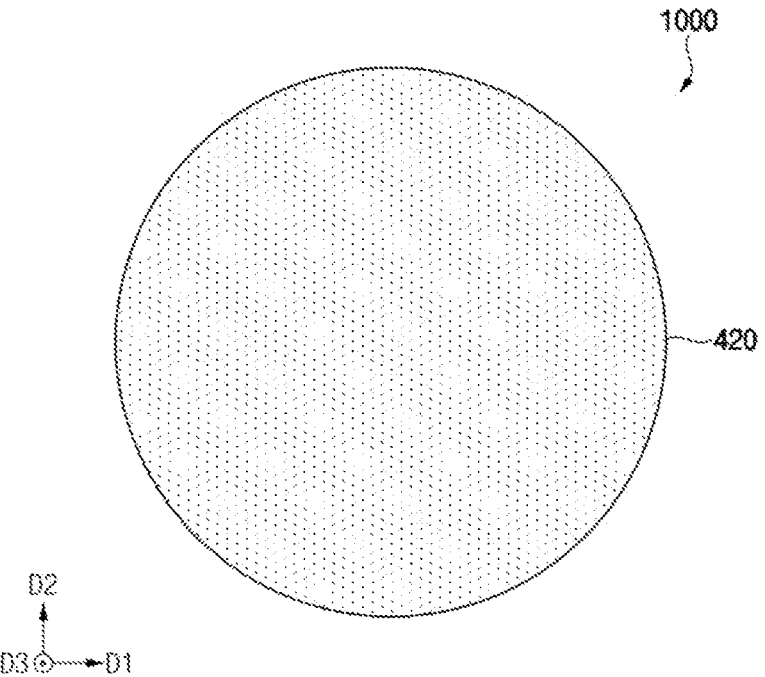

Referring to FIGS. 14 and 15, the first outer oxide layer 321, the second outer oxide layer 322, the third outer oxide layer 331, and the fourth outer oxide layer 332 may be removed together. Accordingly, the SOI wafer 1000 including the base layer 210, the buried oxide layer 410, and the device layer 420 may be manufactured.

In an embodiment, a thickness THD of the device layer 420 may be less than or equal to the difference between the thickness of the membrane 230 (e.g., THM of FIG. 8) and the thickness THC of the cavity 221. For example, the thickness THM of the membrane 230 may be about 2.7 the thickness THC of the cavity 221 may be about 2 and the thickness THD of the device layer 420 may be about 0.7

In addition, the thickness THD of the device layer 420 may be set according to the thickness of the second outer oxide layer 322. For example, the thickness of the second outer oxide layer 322 may be set according to the condition of the additional oxidation process described above with reference to FIGS. 12 and 13, and the thickness of the device layer 420 may be set according to the thickness of the second outer oxide layer 322.

According to the method of manufacturing the SOI wafer 1000 according to an embodiment of the present invention, the membrane-cavity structure 200 having the inlets 222 and 223 may be formed by using the hole array HA formed on the surface of the base layer 100, and oxide layers may be simultaneously grown on the inside of the cavity 221 and the outside of the membrane 230 by performing the oxidation process.

As the buried oxide layer 310 is formed through the oxidation process, complex production processes such as ion implantation and bonding may not be performed, and bonding strength of the buried oxide layer 310 may be improved. In addition, as the outer oxide layers 321 and 322 are formed through the same oxidation process, the thickness of the device layer 420 may be easily adjusted, and the thickness uniformity of the device layer 420 may be improved.

In addition, since the annealing process and the oxidation process, which are main processes, may be performed simultaneously for one lot (25 sheets) (batch fabrication), the manufacturing time of the SOI wafer 1000 can be drastically reduced.

In addition, the above-described manufacturing method can be applied to a method of manufacturing a double or triple SOI wafer, and can also be applied to a method of manufacturing a germanium-on-insulator wafer by applying to germanium rather than silicon.

FIGS. 16, 17, 18, and 19 are diagrams illustrating another example of a method of manufacturing the SOI wafer of FIG. 1.

Figure 16:
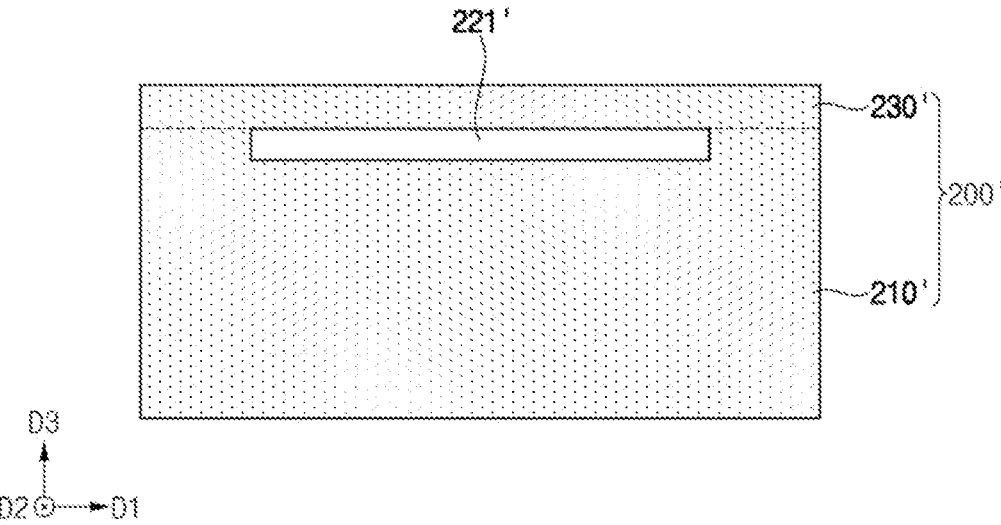
FIGS. 16, 17, 18, and 19 are diagrams illustrating another example of a method of manufacturing the SOI wafer of FIG. 1.
Figure 17:
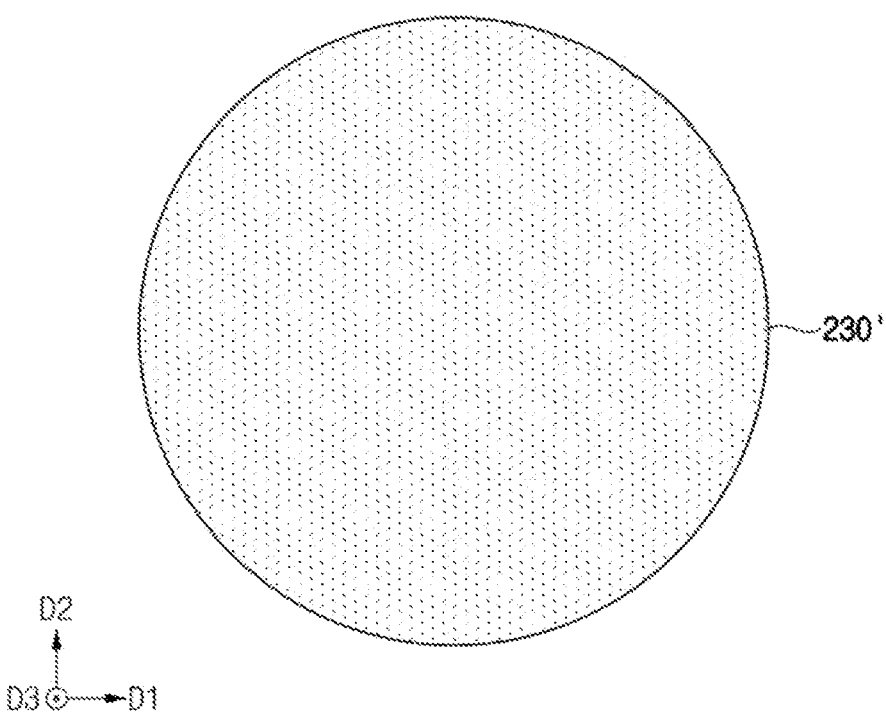

Referring to FIGS. 16 and 17, by performing an annealing process on the wafer 100 on which the hole array HA is formed, a membrane-cavity structure 200' may be formed. For example, the annealing process described in FIGS. 16 and 17 may be a process subsequent to the process described above with reference to FIGS. 4 to 7.

In an embodiment, the annealing process may be performed in a non-reactive gas (e.g., argon/hydrogen atmosphere) under high temperature and atmospheric pressure. When the annealing conditions are performed under atmospheric pressure conditions, the aforementioned stiction failure of the membrane may not occur.

Figure 18:
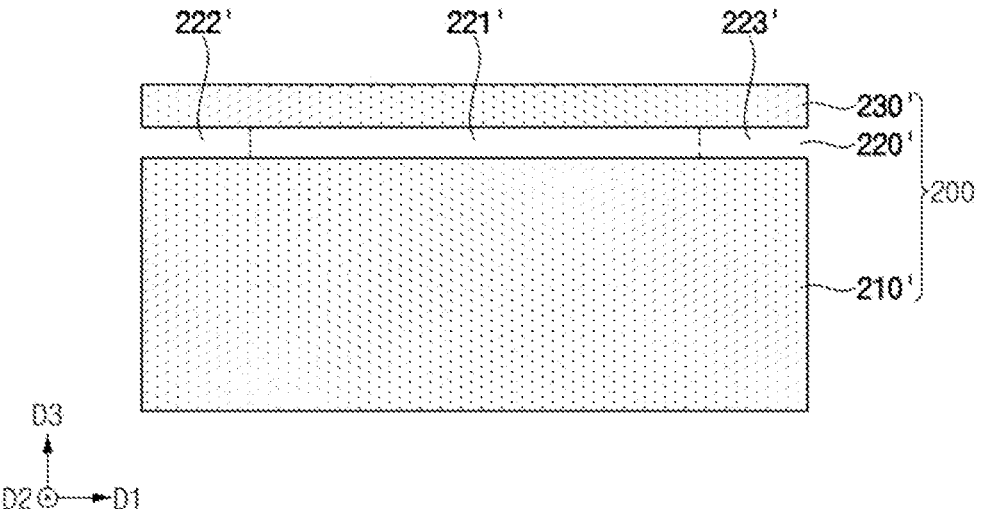
Figure 19:
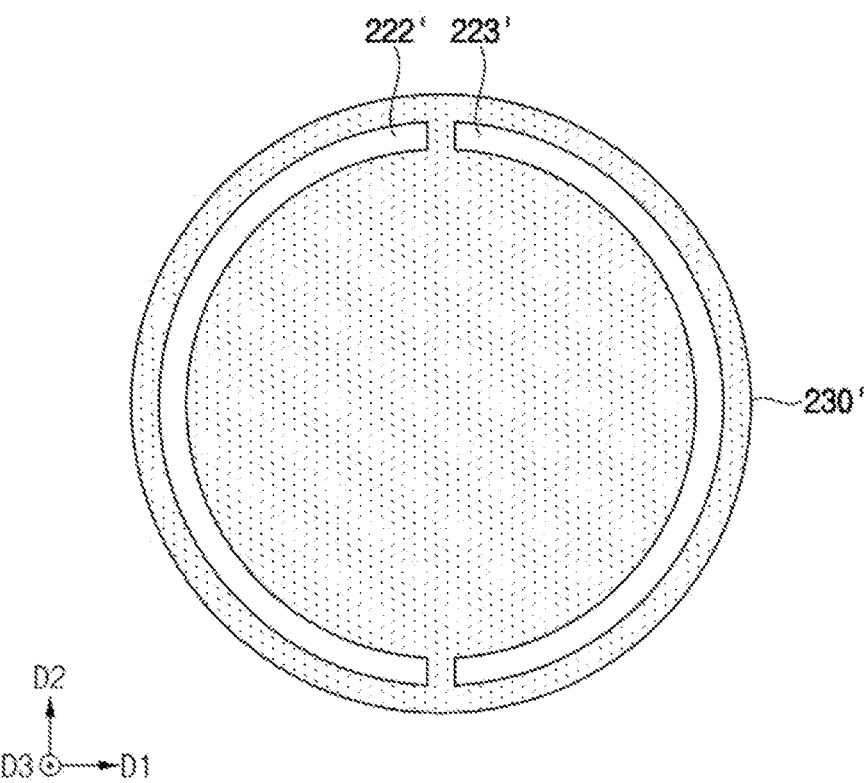

Referring to FIGS. 18 and 19, inlets 222' and 223' may be formed. In an embodiment, as stiction failure of the membrane does not occur, the inlets 222' and 223' may be formed separately from the cavity 221'. In other words, the inlets 222' and 223' may be formed after the cavity 221' is formed. In another embodiment, the inlets 222' and 223' may be formed together with the cavity 221'.

Subsequently, as described above with reference to FIGS. 10 to 15, the SOI wafer 1000 may be manufactured by introducing an oxidizing agent into the cavity 221' through the inlets 222' and 223'.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A method of manufacturing a SOI (silicon-on-Insulator) wafer, the method comprising:
    forming a hole array on a surface of a wafer including a semiconductor material;
    forming a membrane-cavity structure by performing an annealing process on the wafer, the membrane-cavity structure including a cavity corresponding to the hole array and a membrane disposed on the cavity;
    forming a buried oxide layer on an inside of the cavity and a first outer oxide layer on an outside of the membrane; and
    forming a device layer by removing the first outer oxide layer,
    wherein the hole array includes a plurality of holes,
    wherein the cavity is formed by connecting the holes to each other while the annealing process is performed.

2. The method of claim 1, wherein the buried oxide layer and the first outer oxide layer are formed together.

3. The method of claim 1, wherein a thickness of the buried oxide layer is about 1.5 to 2.5 times a thickness of the cavity.

4. The method of claim 1, wherein each of the holes has a preset diameter-to-depth ratio.

5. The method of claim 4, wherein a thickness of the cavity is set according to the diameter-to-depth ratio of the each of the holes.

6. The method of claim 1, further comprising:
    forming an inlet connecting the cavity and an outside.

7. The method of claim 6, wherein the cavity and the inlet are formed together.

8. The method of claim 7, wherein the annealing process is performed in vacuum.

9. The method of claim 6, wherein the cavity and the inlet are formed separately.

10. The method of claim 9, wherein the annealing process is performed at atmospheric pressure.

11. A method of manufacturing a SOI (silicon-on-Insulator) wafer, the method comprising:
    forming a hole array on a surface of a wafer including a semiconductor material;
    forming a membrane-cavity structure by performing an annealing process on the wafer, the membrane-cavity structure including a cavity corresponding to the hole array and a membrane disposed on the cavity;
    forming a buried oxide layer on an inside of the cavity and a first outer oxide layer on an outside of the membrane; and
    forming a device layer by removing the first outer oxide layer,
    wherein the buried oxide layer includes:
    a lower oxide layer formed on a lower portion of the cavity; and
    an upper oxide layer formed on an upper portion of the cavity.

12. The method of claim 11, wherein the lower oxide layer is formed toward to the upper portion, the upper oxide layer is formed toward to the lower portion, and the buried oxide layer is formed while the lower oxide layer and the upper oxide layer contact each other.

13. A method of manufacturing a SOI (silicon-on-Insulator) wafer, the method comprising:

forming a hole array on a surface of a wafer including a semiconductor material;

forming a membrane-cavity structure by performing an annealing process on the wafer, the membrane-cavity structure including a cavity corresponding to the hole array and a membrane disposed on the cavity;

forming a buried oxide layer on an inside of the cavity and a first outer oxide layer on an outside of the membrane;

forming a device layer by removing the first outer oxide layer; and forming a second outer oxide layer on an outside of the membrane, after forming the first outer oxide layer.

14. The method of claim 13, wherein the second outer oxide layer is removed together with the first outer oxide layer.

15. The method of claim 13, wherein a thickness of the device layer is less than or equal to a difference between a thickness of the membrane and a thickness of the cavity.

16. The method of claim 13, wherein a thickness of the device layer is set according to a thickness of the second outer oxide layer.

17. A method of manufacturing a SOI (silicon-on-Insulator) wafer, the method comprising:

forming a hole array on a surface of a wafer including a semiconductor material;

forming a membrane-cavity structure by performing an annealing process on the wafer, the membrane-cavity structure including a cavity corresponding to the hole array, a membrane disposed on the cavity and a base layer disposed under the cavity;

forming a buried oxide layer on an inside of the cavity and a first outer oxide layer on an outside of the membrane;

forming a third outer oxide layer on an outside of the base layer; and forming a device layer by removing the first outer oxide layer, wherein the third outer oxide layer is formed together with the buried oxide layer and the first outer oxide layer.

* * * * *